US010514142B2

(12) United States Patent
Takeuchi (10) Patent No.: US 10,514,142 B2
(45) Date of Patent: Dec. 24, 2019

(54) FLASH LIGHT SOURCE DEVICE

(71) Applicant: HAMAMATSU PHOTONICS K.K., Hamamatsu-shi, Shizuoka (JP)

(72) Inventor: Nozomi Takeuchi, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 16/081,627

(22) PCT Filed: Jan. 26, 2017

(86) PCT No.: PCT/JP2017/002746
§ 371 (c)(1),
(2) Date: Aug. 31, 2018

(87) PCT Pub. No.: WO2017/154394
PCT Pub. Date: Sep. 14, 2017

(65) Prior Publication Data
US 2019/0086048 A1    Mar. 21, 2019

(30) Foreign Application Priority Data

Mar. 10, 2016 (JP) ................................ 2016-046650

(51) Int. Cl.
*F21S 10/06*    (2006.01)
*F21V 23/00*    (2015.01)
(Continued)

(52) U.S. Cl.
CPC .............. *F21S 10/06* (2013.01); *F21V 23/00* (2013.01); *F21V 23/004* (2013.01); *G03B 15/05* (2013.01);
(Continued)

(58) Field of Classification Search
None
See application file for complete search history.

(56) References Cited

U.S. PATENT DOCUMENTS 5,313,373 A * 5/1994 Bjorner ..................... B07C 3/14
362/17

FOREIGN PATENT DOCUMENTS

CN    104919565 A    9/2015
EP    0780924 A2    6/1997
(Continued)

OTHER PUBLICATIONS

International Preliminary Report on Patentability dated Sep. 20, 2018 for PCT/JP2017/002746.

*Primary Examiner* — Ashok Patel
(74) *Attorney, Agent, or Firm* — Drinker Biddle & Reath LLP (57) ABSTRACT

A flash light source device includes: a flash lamp; a wiring board that is provided with a circuit configured to cause the flash lamp to emit light; a housing that is formed of a conductive material and accommodates the flash lamp and the wiring board; and an electromagnetic shield cable that includes a wire directly connected to the wiring board, an electromagnetic shield layer that covers the wire, and an insulating protective layer that covers the electromagnetic shield layer, and extends to the inside and outside of the housing through an opening formed in the housing. The electromagnetic shield layer is exposed at least at a part corresponding to the opening. The part corresponding to the opening in the electromagnetic shield layer is electrically connected to a part defining the opening in the housing.

6 Claims, 10 Drawing Sheets

(51) Int. Cl.
*G03B 15/05* (2006.01)
*H01J 61/90* (2006.01)
*H05B 41/32* (2006.01)
*H05K 9/00* (2006.01)

(52) U.S. Cl.
CPC .............. *H01J 61/90* (2013.01); *H05B 41/32* (2013.01); *H05K 9/00* (2013.01); *H05K 9/0007* (2013.01)

(56) References Cited

FOREIGN PATENT DOCUMENTS

| | | |
|---|---|---|
| JP | S62-59974 U | 4/1987 |
| JP | H07-336085 A | 12/1995 |
| JP | H09-27213 A | 1/1997 |
| JP | H09-102692 A | 4/1997 |
| JP | 2014-170921 A | 9/2014 |
| JP | 2014-179205 A | 9/2014 |

* cited by examiner

FLASH LIGHT SOURCE DEVICE

TECHNICAL FIELD

The present disclosure relates to a flash light source device.

BACKGROUND ART

A flash light source device described in Patent Literature 1 includes a flash lamp, a wiring board that is provided with a circuit configured to cause the flash lamp to emit light, and a housing that accommodates the flash lamp and the wiring board.

CITATION LIST

Patent Literature

Patent Literature 1: Japanese Unexamined Patent Publication No. 2014-179205

SUMMARY OF INVENTION

Technical Problem

The flash light source device described in Patent Literature 1 enables sufficient miniaturization. However, there is a demand for a further reduction in the size of an installation space and the suppression of emission of electromagnetic noise.

An object of the present disclosure is to provide a flash light source device capable of achieving both a reduction in the size of an installation space and the suppression of emission of electromagnetic noise.

Solution to Problem

A flash light source device according to an embodiment of the present disclosure includes: a flash lamp; a wiring board that is provided with a circuit configured to cause the flash lamp to emit light; a housing that is formed of a conductive material and accommodates the flash lamp and the wiring board; and an electromagnetic shield cable that includes a wire directly connected to the wiring board, an electromagnetic shield layer that covers the wire, and an insulating protective layer that covers the electromagnetic shield layer, and extends to the inside and outside of the housing through an opening formed in the housing, in which the electromagnetic shield layer is exposed at least at a part corresponding to the opening, and the part corresponding to the opening in the electromagnetic shield layer is electrically connected to a part defining the opening in the housing.

In the flash light source device, the wire of the electromagnetic shield cable is directly connected to the wiring board. Therefore, for example, compared to a case where the wiring board and the electromagnetic shield cable are electrically connected to each other via a connector, the electromagnetic shield cable can be deflected from the vicinity of the outside of the opening in the housing. Therefore, the installation space of the flash light source device can be reduced in size. In addition, the part corresponding to the opening in the electromagnetic shield layer is electrically connected to the part defining the opening in the housing. Accordingly, compared to a case where the electromagnetic shield layer at the part defining the opening in the housing is covered with the insulating protective layer and the part is not electrically connected to the electromagnetic shield layer, the amount of electromagnetic noise emitted from the wiring board and the like to the outside of the housing can be reduced. As described above, with the flash light source device, both a reduction in the size of the installation space and the suppression of emission of electromagnetic noise can be achieved.

The flash light source device according to the embodiment of the present disclosure may further include: a holding member that is formed of a conductive material and holds the part corresponding to the opening in the electromagnetic shield layer; and a fixing member that fixes the holding member to the part defining the opening in the housing. Accordingly, with a simple configuration, the electromagnetic shield layer and the housing can be reliably, electrically connected to each other.

In the flash light source device according to the embodiment of the present disclosure, the fixing member may be formed of a conductive material. Accordingly, with a simple configuration, the electromagnetic shield layer and the housing can be more reliably, electrically connected to each other.

In the flash light source device according to the embodiment of the present disclosure, in a case where the fixing member is viewed in a direction in which the opening is open, the fixing member may overlap a gap formed between the part defining the opening in the housing and the part corresponding to the opening in the electromagnetic shield layer. Accordingly, the amount of electromagnetic noise emitted from the wiring board and the like to the outside of the housing through the gap can be reduced. Therefore, the emission of electromagnetic noise can be more reliably suppressed.

In the flash light source device according to the embodiment of the present disclosure, the holding member and the fixing member may be disposed outside the housing. Accordingly, the holding member that holds the electromagnetic shield layer can be easily fixed to the part defining the opening in the housing.

In the flash light source device according to the embodiment of the present disclosure, the electromagnetic shield layer may be exposed along the part defining the opening in the housing. Accordingly, since the part of the electromagnetic shield layer that is disposed inside the housing is covered with the insulating protective layer, it is possible to prevent a situation in which the electromagnetic shield layer comes into contact with a certain member and causes a short circuit inside the housing.

In the flash light source device according to the embodiment of the present disclosure, a through-hole in which a sealed container of the flash lamp is disposed may be formed in the housing, the through-hole may be formed in a first wall portion of the housing, and the opening may be formed in a second wall portion of the housing that faces the first wall portion. Accordingly, the installation space of the flash light source device can be reduced in size in a direction perpendicular to a direction in which the first wall portion and the second wall portion face each other.

Advantageous Effects of Invention

According to the present disclosure, it is possible to provide a flash light source device capable of achieving both a reduction in the size of an installation space and the suppression of emission of electromagnetic noise.

DESCRIPTION OF EMBODIMENTS

Hereinafter, an embodiment of the present disclosure will be described in detail with reference to the drawings. In each of the drawings, like elements that are the same or similar are denoted by like reference numbers, and overlapping descriptions will be omitted.

Figure 1:
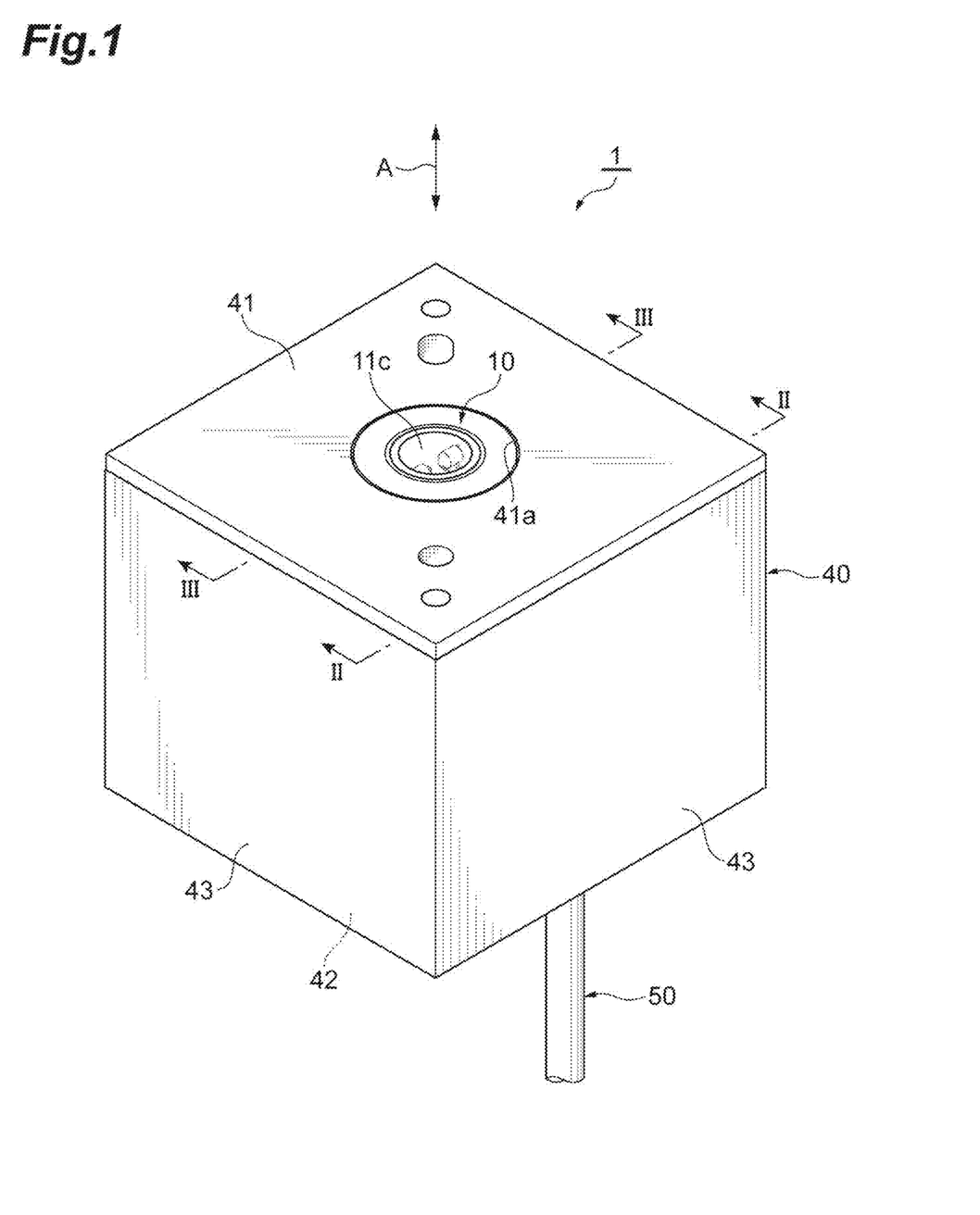
FIG. 1 is a perspective view of a flash light source device of an embodiment.
Figure 2:
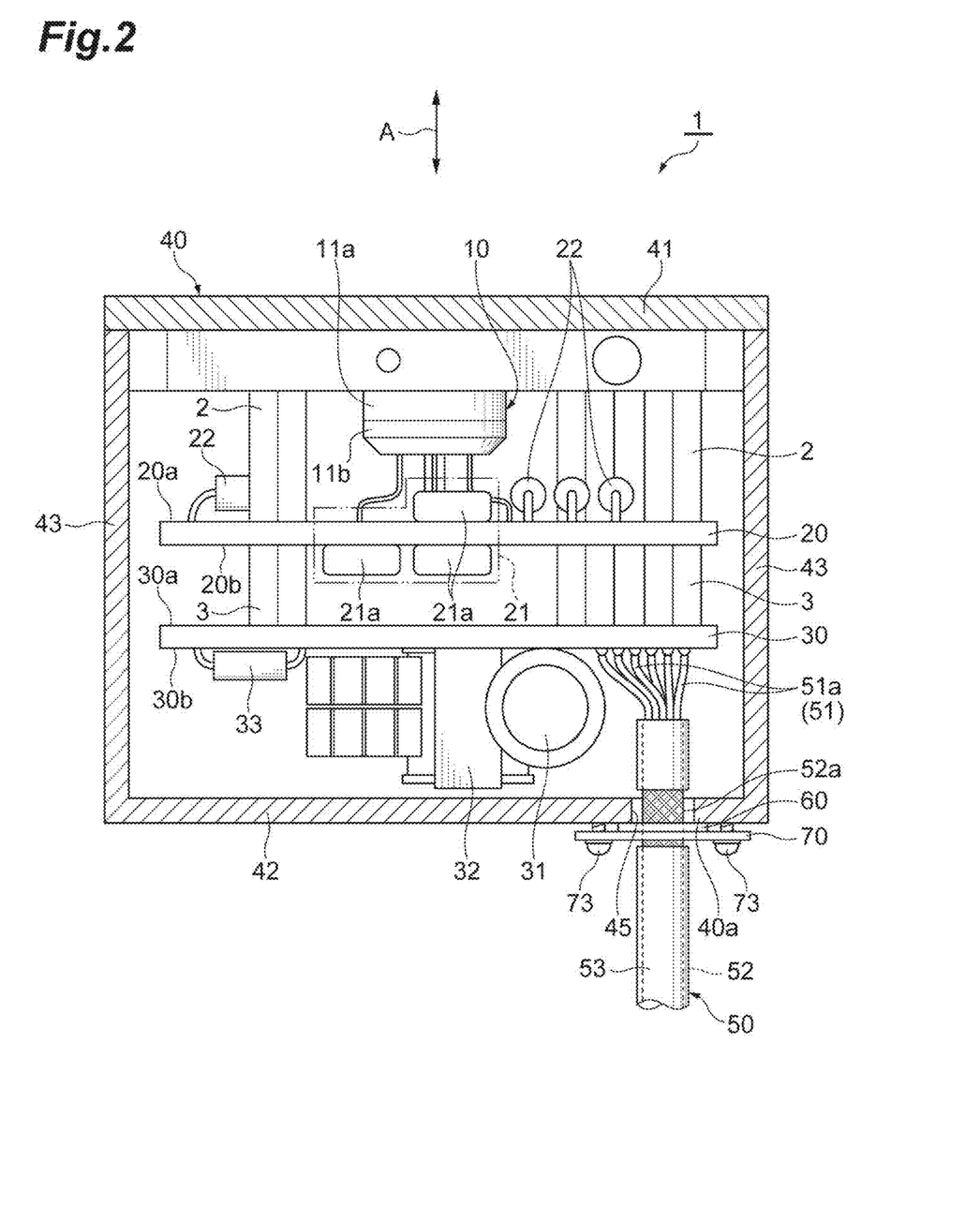
FIG. 2 is a sectional view of the flash light source device taken along line II-II of FIG. 1.
Figure 3:
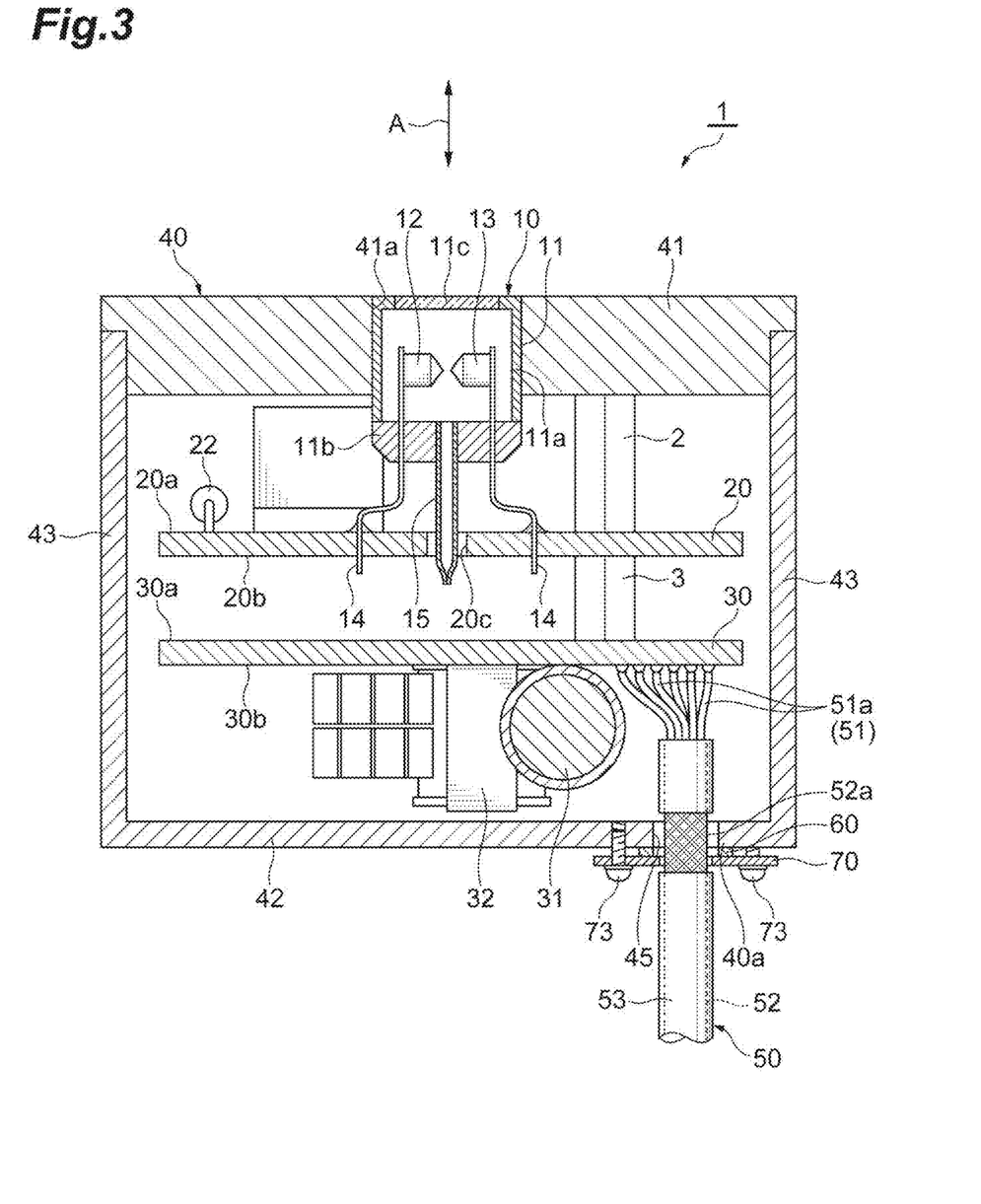
FIG. 3 is a sectional view of the flash light source device taken along line of FIG. 1.

As illustrated in FIGS. 1, 2, and 3, a flash light source device 1 includes a flash lamp 10, two wiring boards 20 and 30, and a housing 40. The flash lamp 10 includes a sealed container 11, a cathode 12, an anode 13, a trigger electrode (not illustrated), a sparker electrode (not illustrated), and a plurality of lead pins 14. The flash lamp 10 has a configuration in which the plurality of lead pins 14 protrude from one end portion of the sealed container 11. Unlike a straight tube type flash lamp (one having a configuration in which a cathode and an anode are disposed apart from each other at both ends of a straight tube), the flash lamp 10 having such a configuration is appropriate for lighting at a high frequency of, for example, 10 Hz or higher.

Discharge gas (for example, xenon gas) is sealed in the sealed container 11. The sealed container 11 is constituted by a side tube 11a, a stein 11b, and a light-transmitting member 11c. The side tube 11a is formed of a metal material, for example, in a cylindrical shape. The center line of the side tube 11a is parallel to a direction A. The stem 11b is formed of a metal material, for example, in a disk shape. The stem 11b blocks one end portion of the side tube 11a. The light-transmitting member 11c is formed of glass, for example, in a disk shape. The light-transmitting member 11c blocks the other end portion of the side tube 11a. A sealing tube 15 is provided in the stem 11b. The sealing tube 15 protrudes from one end portion of the sealed container 11. The sealing tube 15 is used to fill the sealed container 11 with discharge gas, and is sealed after the filling with the discharge gas.

The cathode 12 and the anode 13 face each other in a direction intersecting the direction A (here, a direction perpendicular to the direction A). The cathode 12 and the anode 13 cause an arc discharge in the sealed container 11. The trigger electrode causes a preliminary discharge prior to the arc discharge. The sparker electrode enables stable generation of the arc discharge. Light generated by the arc discharge is emitted along the direction A via the light-transmitting member 11c. The cathode 12, the anode 13, the trigger electrode, and the sparker electrode are respectively fixed to the end portions of the lead pins 14. Each of the lead pins 14 penetrates through the stem 11b via an insulating member (not illustrated) and protrudes from one end portion of the sealed container 11 as described above.

The wiring board 20 has a front surface 20a and a rear surface 20b that oppose each other in the direction A. The wiring board 20 is disposed in the housing 40 in a state in which the front surface 20a faces a first wall portion 41 side of the housing 40. The wiring board 20 is fixed to the first wall portion 41 of the housing 40 with a spacer 2 interposed therebetween. Each of the lead pins 14 of the flash lamp 10 is fixed to the front surface 20a of the wiring board 20 by a conductive joining member such as solder. Accordingly, the flash lamp 10 is electrically connected to a circuit provided in the wiring board 20 (a circuit configured to cause the flash lamp 10 to emit light).

On the front surface 20a and the rear surface 20b of the wiring board 20, circuit components such as a plurality of chip capacitors 21a and a plurality of resistance elements 22 are mounted. The circuit components constitute the circuit configured to cause the flash lamp 10 to emit light. As an example, the plurality of chip capacitors 21a constitute a power supply unit 21 for charging and discharging current to be supplied to the flash lamp 10. In the power supply unit 21, the plurality of chip capacitors 21a are connected in parallel. In addition, a through-hole 20c is formed in the wiring board 20. In the through-hole 20c, the sealing tube 15 of the flash lamp 10 is disposed.

A wiring board 30 has a front surface 30a and a rear surface 30b that oppose each other in the direction A. The wiring board 30 is disposed in the housing 40 in a state in which the front surface 30a faces the wiring board 20 side. The wiring board 30 is fixed to the wiring board 20 with a spacer 3 interposed therebetween. On the front surface 30a and the rear surface 30b of the wiring board 30, circuit components such as an electrolytic capacitor 31, a transformer (boosting unit) 32, and a resistance element 33 are mounted. The circuit components constitute the circuit configured to cause the flash lamp 10 to emit light. As an example, the electrolytic capacitor 31 removes electromagnetic noise. The transformer 32 is provided between the primary circuit on the power source side and the secondary circuit on the flash lamp 10 side. The transformer 32 amplifies (boosts) a pulse voltage of, for example, 100 to 300 V input to the primary side coil, and outputs a pulse voltage of, for example, 5 to 7 kV from the secondary side coil.

The housing 40 includes, in addition to the first wall portion 41 described above, a second wall portion 42 and a plurality of third wall portions 43. The first wall portion 41 and the second wall portion 42 face each other in the direction A with the two wiring boards 20 and 30 interposed therebetween. The plurality of third wall portions 43 stand upright on the peripheral edge portion of the second wall portion 42. The second wall portion 42 and the plurality of third wall portions 43 constitute a container with a bottom, which is integrally formed. In a state of being fitted to an opening of the container with a bottom, the first wall portion 41 is fixed to the opening, for example, by screwing.

A through-hole 41a is formed in the first wall portion 41. The sealed container 11 of the flash lamp 10 is disposed in the through-hole 41a. The outer surface of the light-transmitting member 11c of the flash lamp 10 is flush with the outer surface of the first wall portion 41. The side tube 11a of the sealed container 11 and the first wall portion 41 are into contact with each other to be thermally connected to each other. Accordingly, heat can be efficiently released from the flash lamp 10 that generates heat due to light emission to the first wall portion 41 (furthermore, the first wall portion 41). In addition, the side tube 11a of the sealed container 11 and the first wall portion 41 may be thermally joined to each other by disposing a heat transfer member therebetween.

The housing 40 (that is, the first wall portion 41, the second wall portion 42, and the plurality of third wall portions 43) are formed of a conductive material such as a metal material, for example, in a rectangular parallelepiped shape. The housing 40 accommodates the flash lamp 10 and the two wiring boards 20 and 30. Here, "the housing 40 accommodates the flash lamp 10" means that the housing 40 accommodates a part of each of the lead pins 14 protruding from one end portion of the sealed container 11.

Furthermore, the flash light source device 1 includes an electromagnetic shield cable 50, a holding member 60, and a fixing member 70. The electromagnetic shield cable 50 includes a plurality of wires 51, an electromagnetic shield layer 52, and an insulating protective layer 53. The electromagnetic shield cable 50 is a flexible cable for electrically connecting the two wiring boards 20 and 30 to an external circuit. The electromagnetic shield cable 50 extends to the inside and the outside of the housing 40 through an opening 45 formed in the second wall portion 42 of the housing 40, for example, in a circular shape.

The plurality of wires 51 are exposed to the inside of the housing 40. That is, the electromagnetic shield layer 52 and the insulating protective layer 53 are partially removed from the end portion of the electromagnetic shield cable 50 such that end portions 51a of the plurality of wires 51 are exposed to the outside (the space in the housing 40). Each of the wires 51 is directly connected to a predetermined portion of the rear surface 30b of the wiring board 30. As an example, an insulating protective film is partially removed from the end portion 51a of each of the wires 51 such that the end portion of the conducting wire is exposed and the conducting wire is fixed to a predetermined portion of the rear surface 30b of the wiring board 30 by a conductive joining member such as solder. As described above, each of the wires 51 is directly connected to the wiring board 30 without a connecting component such as a connector interposed therebetween. In addition, each of the wires 51 is, for example, a power supply wire or a signal input wire.

The electromagnetic shield layer 52 covers the plurality of wires 51 over substantially the entire length of the electromagnetic shield cable 50. The electromagnetic shield layer 52 is formed of a conductive material such as a metal material in a tubular shape. As an example, the electromagnetic shield layer 52 is formed in a tubular shape by a plurality of metal wires braided in a mesh shape, and the metal wires are electrically connected to each other. The insulating protective layer 53 covers the electromagnetic shield layer 52 over substantially the entire length of the electromagnetic shield cable 50. The insulating protective layer 53 is formed of an insulating material such as elastomer in a tubular shape.

The electromagnetic shield layer 52 is exposed at a part 52a corresponding to the opening 45. That is, the insulating protective layer 53 is partially removed from the part 52a corresponding to the opening 45 in the electromagnetic shield layer 52 such that the part 52a of the electromagnetic shield layer 52 is exposed to the outside. More specifically, the electromagnetic shield layer 52 is exposed along a part 40a defining the opening 45 in the housing 40 (a part including at least one of a region of the outer surface of the housing 40 along the edge of the opening 45, the inner surface of the opening 45, and a region of the inner surface of the housing 40 along the edge of the opening 45). That is, the insulating protective layer 53 is removed annularly along the part 40a defining the opening 45 in the housing 40, so that the part 52a of the electromagnetic shield layer 52 is exposed to the outside.

Figure 4:
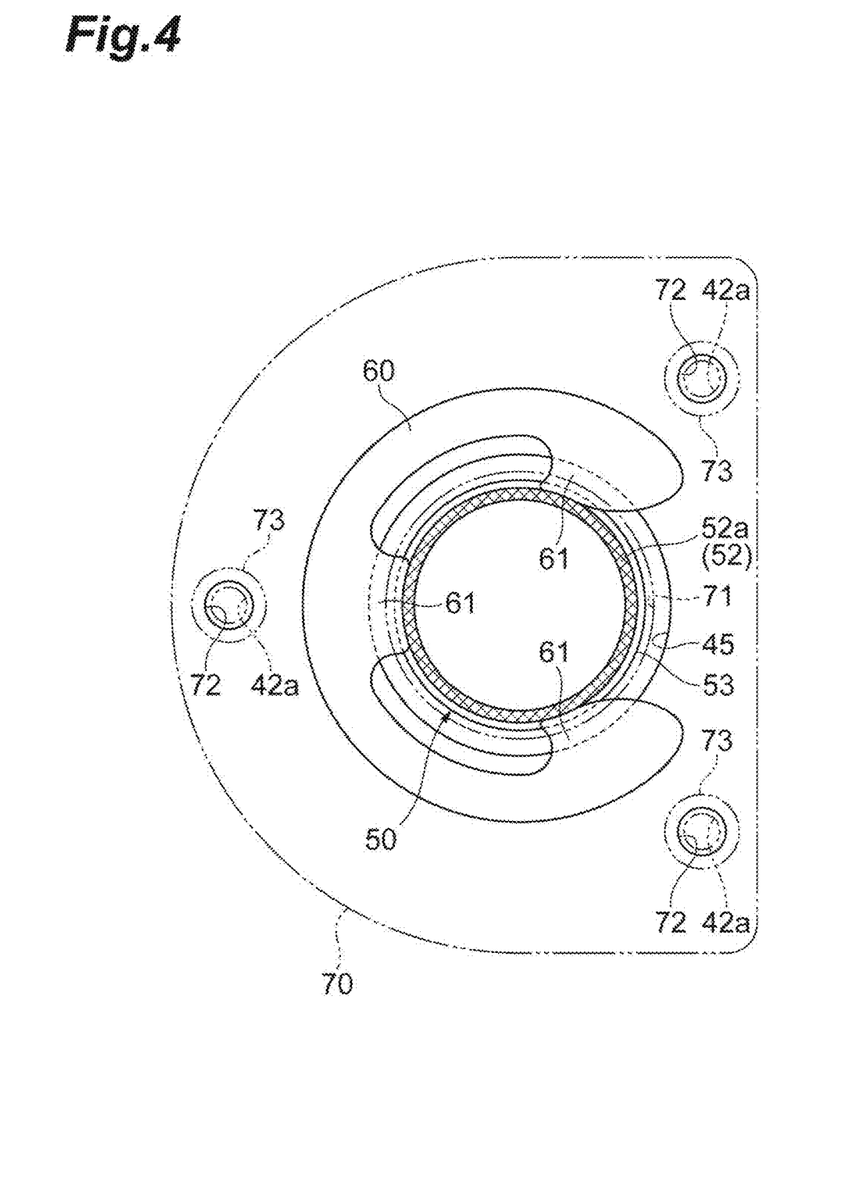
FIG. 4 is a plan view of a holding and fixing mechanism of the flash light source device of FIG. 1.

As illustrated in FIG. 4, the holding member 60 is formed of a conductive material such as a metal material in an annular shape (C-shape) that is partially cut out. The holding member 60 is provided with a plurality of claw portions 61 protruding inward. The holding member 60 comes into contact with the part 52a of the electromagnetic shield layer 52 with the plurality of claw portions 61 by the elastic deformation force and holds the part 52a. As illustrated in FIGS. 2 and 3, the holding member 60 is into contact with the part 40a of the housing 40 on the outside of the housing 40. Accordingly, the part 52a of the electromagnetic shield layer 52 is reliably, electrically connected to the part 40a of the housing 40 via the holding member 60.

As illustrated in FIG. 4, the fixing member 70 is formed of a conductive material such as a metal material in a plate shape. In the fixing member 70, an opening 71 and a plurality of through-holes 72 are formed. The electromagnetic shield cable 50 is inserted through the opening 71. The plurality of through-holes 72 respectively correspond to a plurality of threaded holes 42a formed in the second wall portion 42 of the housing 40. A screw 73 formed of a conductive material such as a metal material is screwed into each of the threaded holes 42a through the corresponding through-hole 72. In addition, in FIG. 4, the fixing member 70 and the screws 73 are indicated by two-dot chain lines, and the wires 51 are omitted. As illustrated in FIGS. 2 and 3, the fixing member 70 causes the holding member 60 to be interposed between the fixing member 70 and the housing 40 on the outside of the housing 40 so as to cover the holding member 60 such that the holding member 60 is reliably brought into contact with and fixed to the part 40a of the housing 40.

As illustrated in FIG. 4, the inner diameter of the opening 45 of the housing 40 is larger than the outer diameter of the electromagnetic shield cable 50. The inner diameter of the opening 71 of the fixing member 70 is larger than the outer diameter of the electromagnetic shield cable 50 and is smaller than the inner diameter of the opening 45 of the housing 40. Therefore, in a case where the fixing member 70 is viewed in a direction in which the opening 45 is open (a direction parallel to the center line of the opening 45 having a circular shape), to cover the gap formed between the part 40a of the housing 40 and the part 52a of the electromagnetic shield layer 52, the fixing member 70 overlaps the gap.

The operation of the flash light source device 1 configured as described above will be described. First, power is supplied to the main power source unit provided in the wiring board 30 via the electromagnetic shield cable 50 such that the power supply unit 21 is charged. Thereafter, a voltage is applied between the cathode 12 and the anode 13. On the other hand, a pulse voltage of, for example, 100 to 300 V, is applied to the primary side coil of the transformer 32. The pulse voltage applied to the primary side coil is amplified (boosted) in the transformer 32, and a pulse voltage of, for example, 5 to 7 kV is output from the secondary side coil. The pulse voltage output from the secondary side coil is applied to the anode 13 and the sparker electrode.

In the flash lamp 10, first, a preliminary discharge occurs due to the sparker electrode, and subsequently, a preliminary discharge occurs between the cathode 12 or the anode 13 and the trigger electrode, whereby a preliminary discharge path is formed. Immediately thereafter, a main discharge occurs along the preliminary discharge path between the cathode 12 and the anode 13. When the main discharge (arc discharge) occurs between the cathode 12 and the anode 13, a current is supplied through the main power source unit provided on the wiring board 30 and accumulated charge is output from the power supply unit 21. Light generated by the arc discharge is emitted along the direction A via the light-transmitting member 11c.

As described above, in the flash light source device 1, the wires 51 of the electromagnetic shield cable 50 are directly connected to the wiring board 30. Therefore, for example, compared to a case where the wiring board 30 and the electromagnetic shield cable 50 are electrically connected to each other via a connector, the electromagnetic shield cable 50 can be deflected from the vicinity of the outside of the opening 45 in the housing 40. Therefore, the installation space of the flash light source device 1 can be reduced in size. In addition, the part 52a corresponding to the opening 45 in the electromagnetic shield layer 52 is electrically connected to the part 40a defining the opening 45 in the housing 40. Accordingly, compared to a case where the electromagnetic shield layer 52 at the part 40a defining the opening 45 in the housing 40 is covered with the insulating protective layer 53 and the part 40a is not electrically connected to the electromagnetic shield layer 52, the amount of electromagnetic noise emitted from each of the wiring boards 20 and 30 and the like to the outside of the housing 40 can be reduced. As described above, with the flash light source device 1, both a reduction in the size of the installation space and the suppression of emission of electromagnetic noise can be achieved.

In addition, in the flash light source device 1, the transformer 32 that amplifies (boosts) a pulse voltage is provided on the wiring board 30, and the pulse voltage amplified (boosted) by the transformer 32 is input to each of the lead pins 14 of the flash lamp 10. Therefore, in particular, in the flash light source device 1, it is extremely important to accommodate the flash lamp 10 and the wiring boards 20 and 30 in the housing 40 and to reduce the amount of electromagnetic noise emitted from each of the wiring boards 20 and 30 and the like to the outside of the housing 40 by the configuration as described above.

In addition, the flash light source device 1, the part 52a of the electromagnetic shield layer 52 is held by the holding member 60 formed of a conductive material, and the holding member 60 is fixed to the part 40a of the housing 40 by the fixing member 70. Accordingly, with a simple configuration, the electromagnetic shield layer 52 and the housing 40 can be reliably, electrically connected to each other.

In addition, in the flash light source device 1, the fixing member 70 is formed of a conductive material. Accordingly, with a simple configuration, the electromagnetic shield layer 52 and the housing 40 can be more reliably, electrically connected to each other.

In addition, in the flash light source device 1, in a case where the fixing member 70 is viewed in the direction in which the opening 45 is open, the fixing member 70 overlaps the gap formed between the part 40a of the housing 40 and the part 52a of the electromagnetic shield layer 52. Accordingly, since the gap is covered with the fixing member 70, the amount of electromagnetic noise emitted from the wiring boards 20 and 30 and the like to the outside of the housing 40 through the gap can be reduced. Therefore, the emission of electromagnetic noise can be more reliably suppressed. In addition, the inner diameter of the opening 45 of the housing 40 and the inner diameter of the opening 71 of the fixing member 70 are larger than the outer diameter of the electromagnetic shield cable 50 to enable the electromagnetic shield cable 50 to be easily inserted.

In addition, in the flash light source device 1, the holding member 60 and the fixing member 70 are disposed outside the housing 40. Accordingly, the holding member 60 that holds the electromagnetic shield layer 52 can be easily fixed to the part 40a of the housing 40.

In addition, in the flash light source device 1, the electromagnetic shield layer 52 is exposed along the part 40a of the housing 40. Accordingly, since the part of the electromagnetic shield layer 52 that is disposed inside the housing 40 is covered with the insulating protective layer 53, it is possible to prevent a situation in which the electromagnetic shield layer 52 comes into contact with a certain member and causes a short circuit inside the housing 40. Furthermore, even when the electromagnetic shield cable 50 is pulled against the holding force of the electromagnetic shield cable 50 by the holding member 60, the insulating protective layer 53 that covers the part of the electromagnetic shield layer 52 that is disposed inside the housing 40 comes into contact with the holding member 60, so that a physical load is prevented from being applied to the connection portion between the wiring board 30 and each of the wires 51.

In addition, in the flash light source device 1, the through-hole 41a in which the sealed container 11 of the flash lamp 10 is disposed is formed in the first wall portion 41 of the housing 40, and the opening 45 through which the electromagnetic shield cable 50 is inserted is formed in the second wall portion 42 of the housing 40 that faces the first wall portion 41. Accordingly, in particular, the installation space of the flash light source device 1 can be reduced in size in the direction perpendicular to the direction in which the first wall portion 41 and the second wall portion 42 face each other (that is, the direction A).

Figure 5:
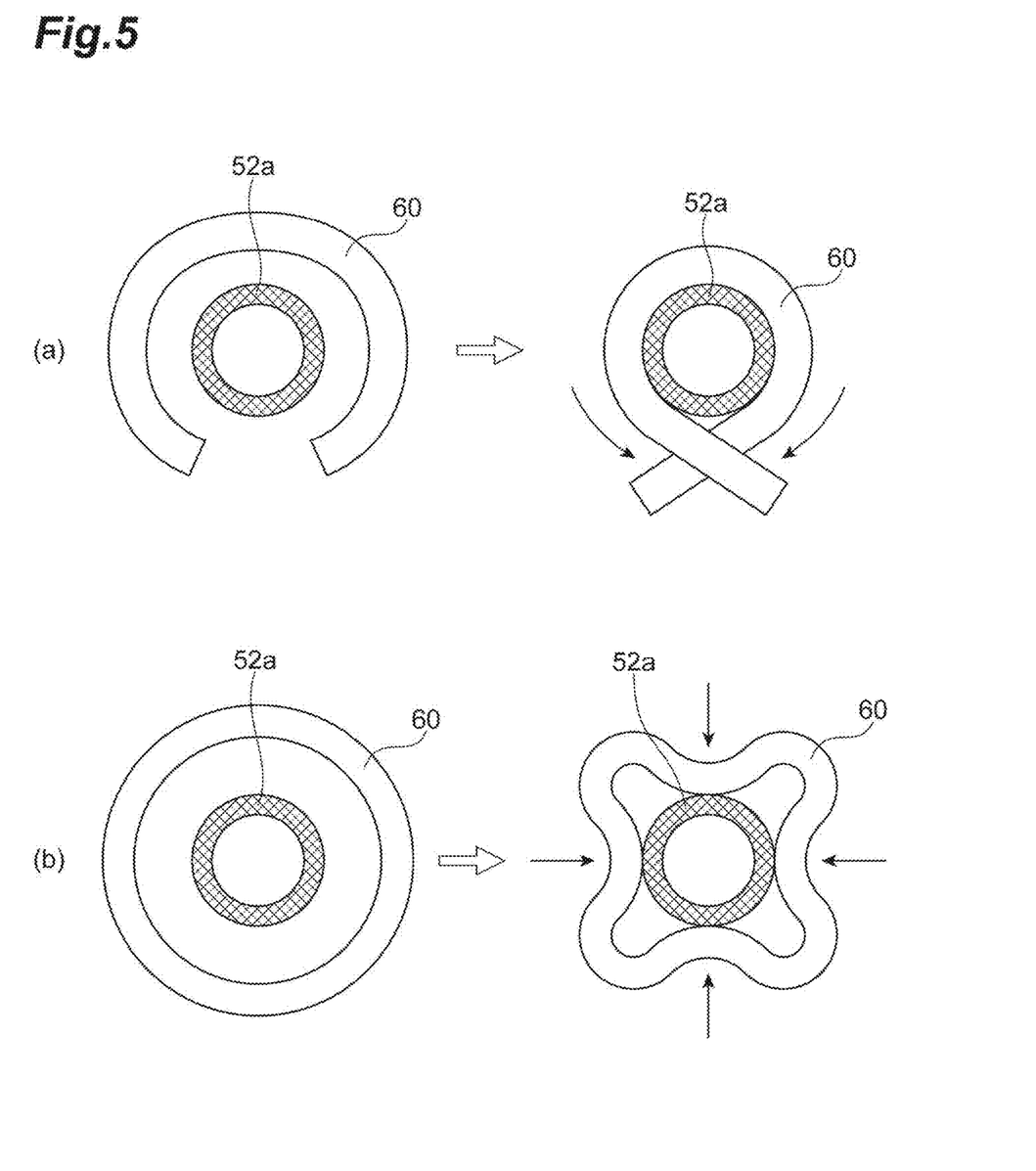
FIG. 5(a) is a plan view of a first modification example of the holding and fixing mechanism.
FIG. 5(b) is a plan view of a second modification example of the holding and fixing mechanism.

While the embodiment of the present disclosure has been described above, the flash light source device of the present disclosure is not limited to the above-described embodiment. For example, as illustrated in FIGS. 5(a) and 5(b), instead of the holding member 60 described above, a holding member 60 that holds the part 52a of the electromagnetic shield layer 52 by plastic deformation may be used. The holding member 60 illustrated in FIG. 5(a) is formed of a conductive material such as a metal material in an annular shape (C-shape) that is partially cut out. In this case, the holding member 60 is deformed so that both end portions of the holding member 60 that face each other at the cut-out part overlap each other, the part 52a of the electromagnetic shield layer 52 comes into contact with the holding member 60, and the part 52a is held by the holding member 60. The holding member 60 illustrated in FIG. 5(b) is formed of a conductive material such as a metal material in an annular shape. In this case, the parts of the holding member 60, the parts that face each other with the part 52a of the electromagnetic shield layer 52 interposed therebetween, are deformed so as to protrude inward into a convex shape such that the part 52a of the electromagnetic shield layer 52 comes into contact with the holding member 60, and the part 52a is held by the holding member 60. In any case of FIGS. 5(a) and 5(b), the holding member 60 can be fixed to the part 40a of the housing 40 using the fixing member 70 described above.

Figure 6:
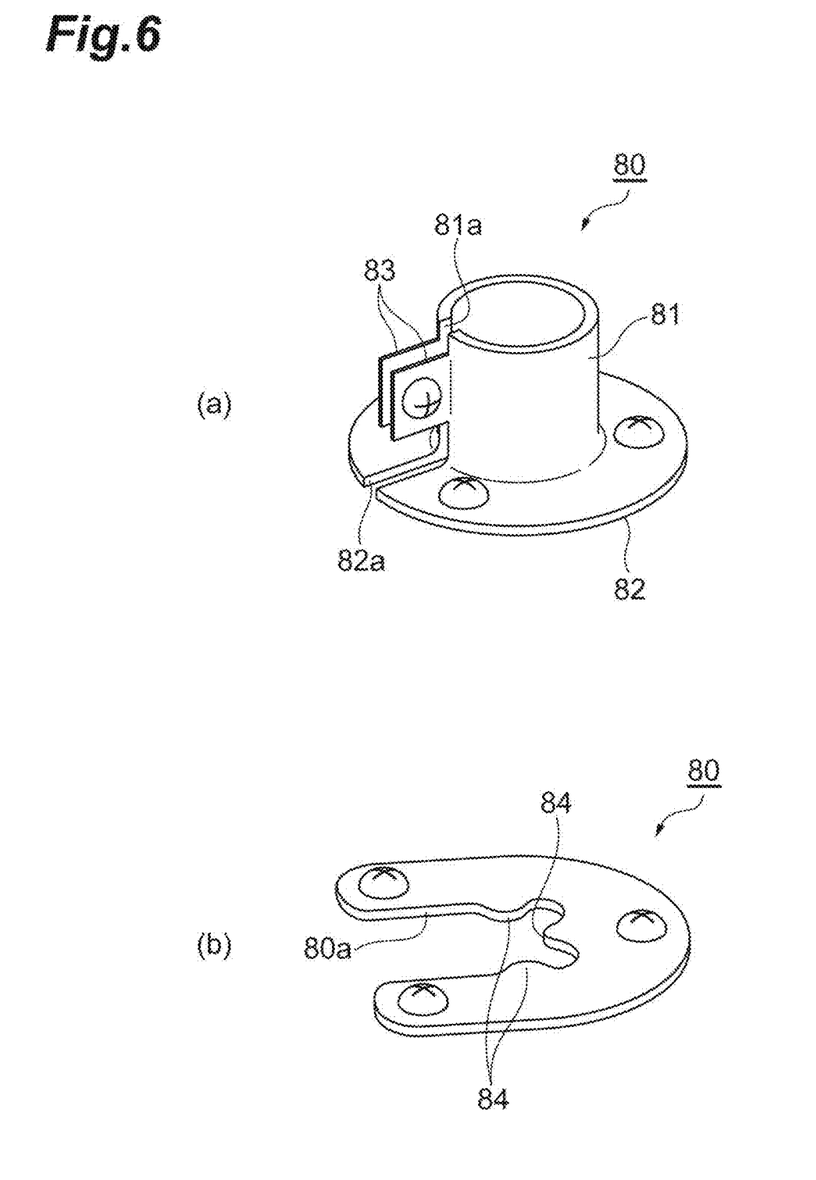
FIG. 6(a) is a perspective view of a third modification example of the holding and fixing mechanism.
FIG. 6(b) is a perspective view of a fourth modification example of the holding and fixing mechanism.

In addition, as illustrated in FIGS. 6(a) and 6(b), instead of the holding member 60 and the fixing member 70 described above, a holding member 80 having both a holding function and a fixing function may be used. The holding member 80 illustrated in FIG. 6(a) includes a circular tube part 81, a flange part 82, and a pair of base parts 83. A slit 81a is formed in the circular tube part 81. The pair of base parts 83 are provided in the circular tube part 81 so as to face each other with the slit 81a interposed therebetween. The flange part 82 is provided at one end portion of the circular tube part 81. A slit 82a is formed in the flange part 82 so as to be continuous with the slit 81a. The circular tube part 81, the flange part 82, and the pair of base parts 83 are integrally formed of a conductive material such as a metal material. In this case, in a state in which the part 52a of the electromagnetic shield layer 52 is inserted through the circular tube part 81, the distance between the pair of base parts 83 is narrowed by a screw, so that the part 52a of the electromagnetic shield layer 52 comes into contact with the circular tube part 81 and the part 52a is held by the circular tube part 81. In addition, the flange part 82 is fixed to the part 40a of the housing 40 by a screw. The holding member 80 illustrated in FIG. 6(b) is a U-shaped member in which a groove 80a into which the electromagnetic shield cable 50 is introduced is formed in a flat plate-shaped member, and in the U-shaped member, a plurality of claw portions 84 that protrude to narrow the groove 80a are provided. The holding member 80 is configured to be fixed to the part 40a of the housing 40 by a screw. In this case, the part 52a of the electromagnetic shield layer 52 comes into contact with each of the claw portions 84 of the holding member 80, and the part 52a is held by the plurality of claw portions 84.

In addition, the part 52a of the electromagnetic shield layer 52 may be brought into direct contact with the part 40a of the housing 40. In an example illustrated in FIG. 7, the end portion of the electromagnetic shield layer 52 including the part 52a corresponding to the opening 45 is exposed, and the exposed end portion of the electromagnetic shield layer 25 is deformed in a disk shape having a diameter larger than the opening 45, so that the a flange portion 52b is formed in the part 52a of the electromagnetic shield layer 52. In addition, the flange portion 52b is fixed to the part 40a of the housing 40 by the fixing member 70 such that the part 52a of the electromagnetic shield layer 52 is brought into direct contact with the part 40a of the housing 40.

Figure 8:
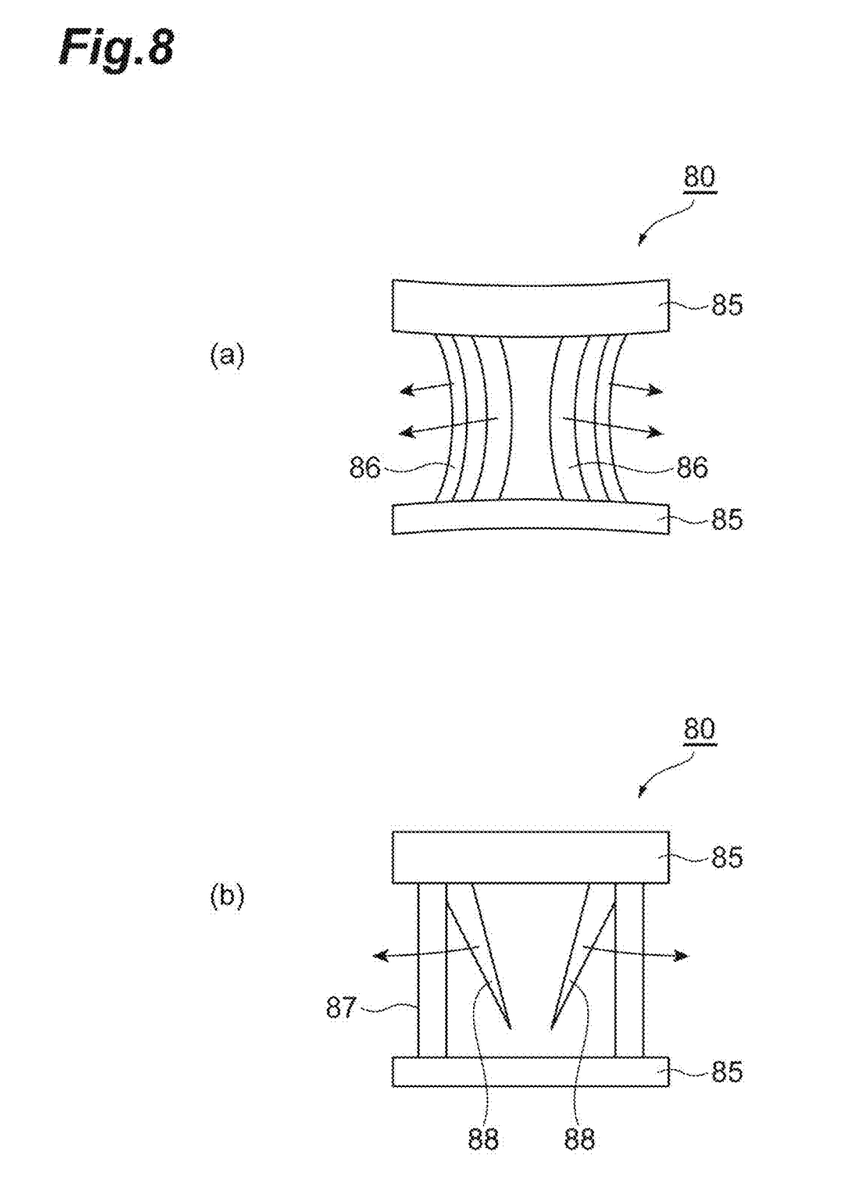
FIG. 8(a) is a side view of a sixth modification example of the holding and fixing mechanism.
FIG. 8(b) is a side view of a seventh modification example of the holding and fixing mechanism.

In addition, as illustrated in FIGS. 8(a) and 8(b), instead of the holding member 60 and the fixing member 70, a holding member 80 having both a holding function and a fixing function may be used. The holding member 80 illustrated in FIG. 8(a) includes a pair of annular parts 85 and a plurality of support parts 86. The plurality of support parts 86 are stretched between the pair of annular parts 85 so that the space of the center portion becomes narrow. The pair of annular parts 85 and the plurality of support parts 86 are integrally formed of a conductive material such as a metal material. In this case, in a state in which the plurality of support parts 86 are disposed in the opening 45 of the housing 40, the part 52a of the electromagnetic shield layer 52 is inserted through the holding member 80 such that the plurality of support parts 86 are deformed to widen the space of the center portion and come into contact with the part 52a of the electromagnetic shield layer 52. Accordingly, the part 52a of the electromagnetic shield layer 52 is held by the plurality of support parts 86 and the part 52a of the electromagnetic shield layer 52 is electrically connected and fixed to the part 40a of the housing 40. A holding member 80 illustrated in FIG. 8(b) includes a pair of annular parts 85, a plurality of support parts 87, and a plurality of claw parts 88. The plurality of support parts 87 are stretched between the pair of annular parts 85. The plurality of claw parts 88 extend from one pair of annular parts 85 so that the space of the center portion becomes narrow. The pair of annular parts 85, the plurality of support parts 87, and the plurality of claw parts 88 are integrally formed of a conductive material such as a metal material. In this case, in a state in which the plurality of support parts 87 are fixed in the opening 45 of the housing 40, the part 52a of the electromagnetic shield layer 52 is inserted through the holding member 80 such that the plurality of claw parts 88 are deformed to widen the space of the center portion and come into contact with the part 52a of the electromagnetic shield layer 52. Accordingly, the part 52a of the electromagnetic shield layer 52 is held by the plurality of claw parts 88 and the part 52a of the electromagnetic shield layer 52 is electrically connected and fixed to the part 40a of the housing 40.

Figure 9:
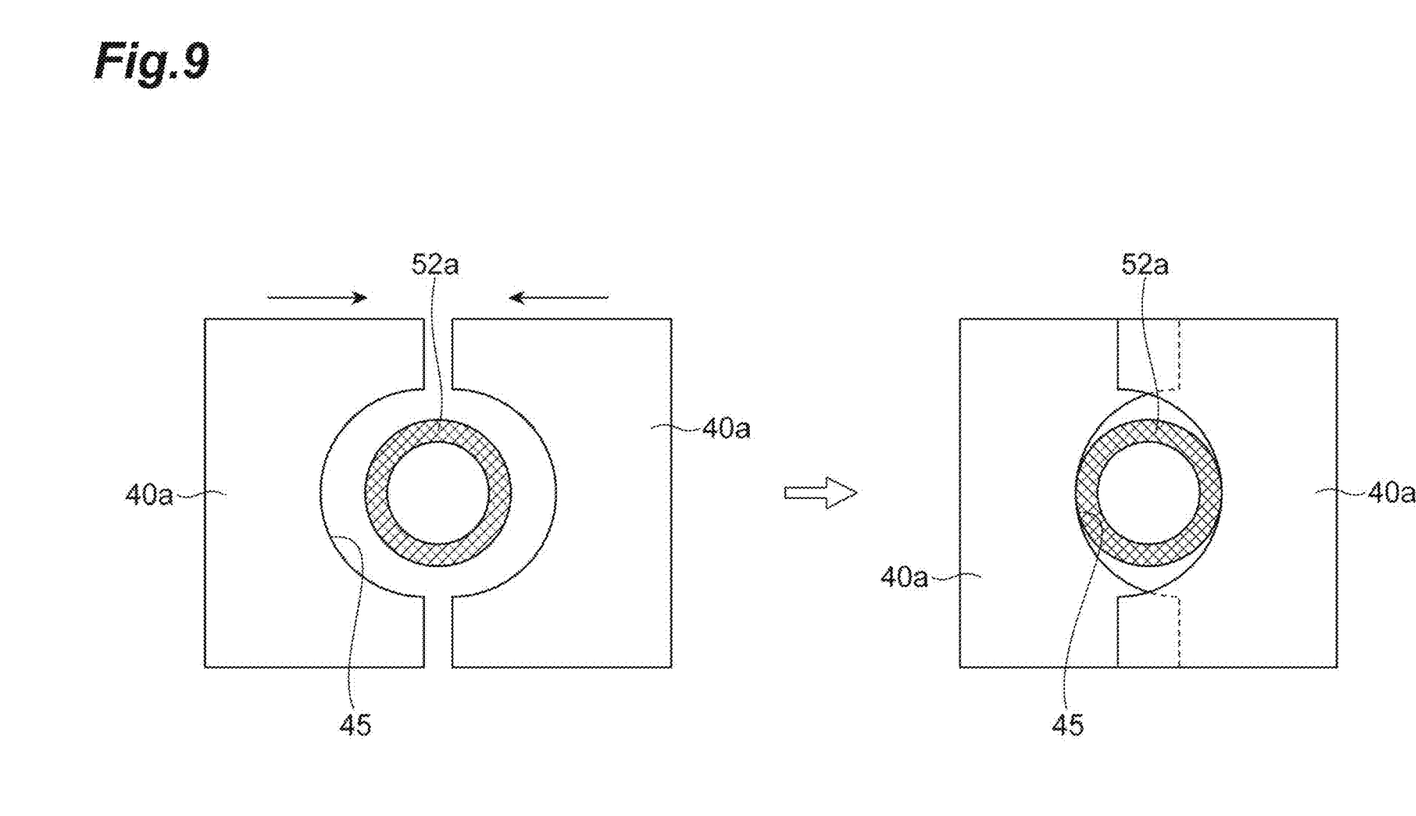
FIG. 9 is a plan view of an eighth modification example of the holding and fixing mechanism.
Figure 10:
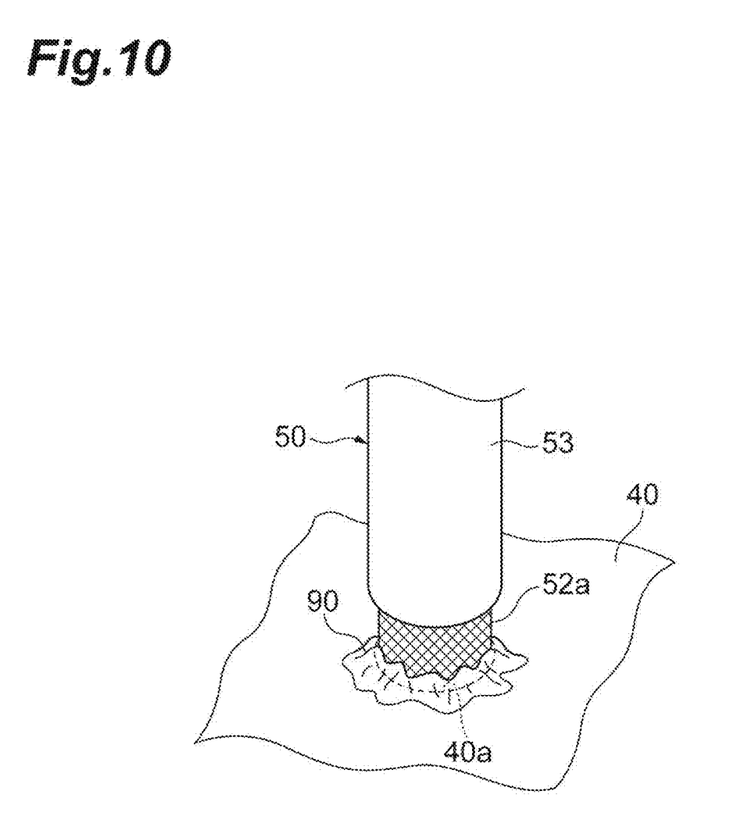
FIG. 10 is a perspective view of a ninth modification example of the holding and fixing mechanism.

In addition, as illustrated in FIG. 9, the part 40a defining the opening 45 in the housing 40 may be constituted by a plurality of movable parts having arc shaped grooves so that the size of the opening 45 is variable. In this case, one of the parts constituting the part 40a of the housing 40 is shifted relative to the other part in a direction perpendicular to FIG. 9 (a direction intersecting the direction in which the opening 45 is open) to achieve an overlapping positional relationship, so that the size (width) of the opening 45 is narrowed and the part 52a of the electromagnetic shield layer 52 can be interposed therebetween. Accordingly, the part 52a of the electromagnetic shield layer 52 is electrically connected and fixed to the part 40a of the housing 40. In addition, as illustrated in FIG. 10, the part 52a of the electromagnetic shield layer 52 may be brought into contact with the part 40a of the housing 40 by a conductive joining member 90 such as solder, and the part 52a may be fixed to the part 40a of the housing 40 by the conductive joining member 90. Alternatively, the part 52a of the electromagnetic shield layer 52 may be directly joined to the part 40a of the housing 40 by welding.

Furthermore, the wiring board provided with the circuit configured to cause the flash lamp 10 to emit light is not limited to the two wiring boards 20 and 30 and may be a single wiring board or may be three or more wiring boards. In addition, the opening 45 may be formed in a wall portion of the housing 40 other than the second wall portion 42.

Figure 7:
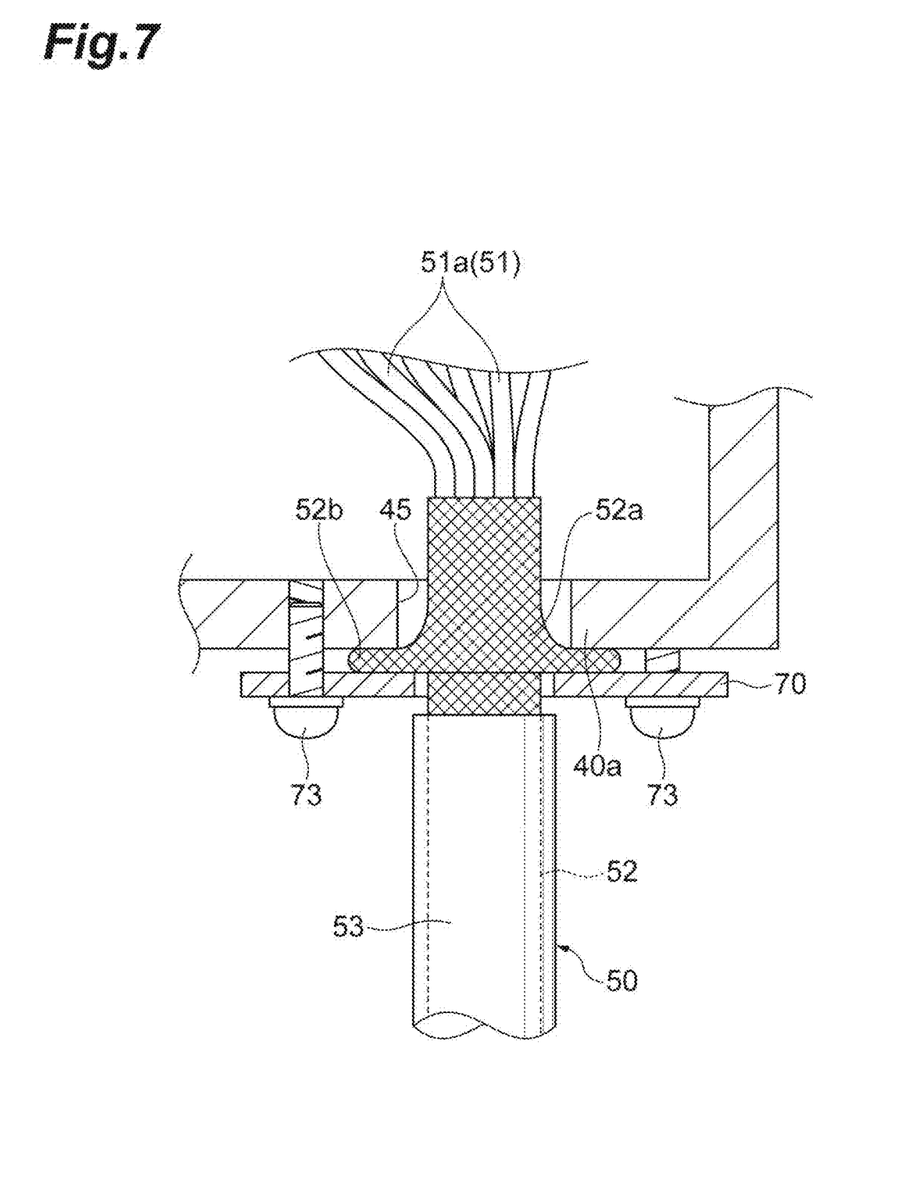
FIG. 7 is a sectional view of a fifth modification example of the holding and fixing mechanism.

In addition, in the electromagnetic shield cable 50, the electromagnetic shield layer 52 may be exposed at least at the part of the housing 40 corresponding to the opening 45. As an example, as illustrated in FIG. 7, the end portion of the electromagnetic shield layer 52 including the part 52a corresponding to the opening 45 may be exposed. In addition, the number of wires 51 is not limited.

In addition, the holding member 60 and the fixing member 70 may be disposed inside the housing 40. In addition, the fixing member 70 may not be formed of a conductive material as long as at least the holding member 60 is formed of a conductive material.

In addition, the side tube 11a of the sealed container 11 of the flash lamp 10 may be formed of another material (for example, glass and the like) in another shape (for example, substantially polygonal tube shape). In addition, the flash lamp 10 is of a head-on type that extracts light in a direction along the direction A but may also be of a side-on type that extracts light in a direction intersecting the direction A. In addition, the cathode 12 and the anode 13 are arranged in the direction intersecting the direction A but may also be arranged in the direction along the direction A. In addition, the plurality of lead pins 14 of the flash lamp 10 are directly fixed to the wiring board 20 by the conductive joining member such as solder but may also be fixed to the wiring board 20 via a socket to which the lead pins 14 are fitted.

REFERENCE SIGNS LIST

1: flash light source device, 10: flash lamp, 11: sealed container, 20, 30: wiring board, 40: housing, 40*a*: part, 41: first wall portion, 41*a*: through-hole, 42: second wall portion, 45: opening, 50: electromagnetic shield cable, 51: wire, 52: electromagnetic shield layer, 52*a*: part, 53: insulating protective layer, 60: holding member, 70: fixing member.

The invention claimed is:

1. A flash light source device comprising:
   a flash lamp;
   a wiring board that is provided with a circuit configured to cause the flash lamp to emit light;
   a housing that is formed of a conductive material and accommodates the flash lamp and the wiring board; and
   an electromagnetic shield cable that includes a wire directly connected to the wiring board, an electromagnetic shield layer that covers the wire, and an insulating protective layer that covers the electromagnetic shield layer, and extends to the inside and outside of the housing through an opening formed in the housing,
   wherein the electromagnetic shield layer is exposed at least at a part corresponding to the opening, and
   the part corresponding to the opening in the electromagnetic shield layer is electrically connected to a part defining the opening in the housing by a plate-shaped fixing part formed of a conductive material.

2. The flash light source device according to claim 1, wherein the fixing part includes
   a holding member that is formed of a conductive material and holds the part corresponding to the opening in the electromagnetic shield layer and
   a fixing member that fixes the holding member to the part defining the opening in the housing.

3. The flash light source device according to claim 2, wherein the holding member and the fixing member are disposed outside the housing.

4. The flash light source device according to claim 2, wherein, in a case where the fixing member is viewed in a direction in which the opening is open, the fixing member overlaps a gap formed between the part defining the opening in the housing and the part corresponding to the opening in the electromagnetic shield layer.

5. The flash light source device according to claim 1, wherein a through-hole in which a sealed container of the flash lamp is disposed is formed in the housing,
   the through-hole is formed in a first wall portion of the housing, and
   the opening is formed in a second wall portion of the housing that faces the first wall portion.

6. The flash light source device according to claim 1, wherein the electromagnetic shield layer is exposed along the part defining the opening in the housing, and
   the insulating protective layer covers the electromagnetic shield layer on the inside and the outside of the part defining the opening, in the housing.

\* \* \* \* \*